United States Patent
Loftus et al.

(10) Patent No.: US 9,285,430 B2
(45) Date of Patent: Mar. 15, 2016

(54) MONITOR SYSTEM AND METHOD FOR STORED BATTERY

(71) Applicant: FORD GLOBAL TECHNOLOGIES, LLC, Dearborn, MI (US)

(72) Inventors: Michael Edward Loftus, Northville, MI (US); Ben A. Tabatowski-Bush, South Lyon, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 217 days.

(21) Appl. No.: 14/013,803

(22) Filed: Aug. 29, 2013

(65) Prior Publication Data

US 2015/0061603 A1    Mar. 5, 2015

(51) Int. Cl.
*H02J 7/00* (2006.01)
*G01R 31/36* (2006.01)
*H04Q 9/00* (2006.01)

(52) U.S. Cl.
CPC ........... *G01R 31/3606* (2013.01); *H02J 7/0052* (2013.01); *H04Q 9/00* (2013.01); *G01R 31/3689* (2013.01); *H04Q 2209/10* (2013.01); *H04Q 2209/40* (2013.01)

(58) Field of Classification Search
CPC ............................ G01R 31/3606; H02J 7/0052
USPC ........................................................ 320/137
See application file for complete search history.

(56) References Cited

U.S. PATENT DOCUMENTS

| | | | | |
|---|---|---|---|---|
| 4,387,334 A * | 6/1983 | Loper | ............. | 320/136 |
| 5,432,429 A * | 7/1995 | Armstrong et al. | ............ | 320/136 |
| 5,977,750 A * | 11/1999 | Ng et al. | ......... | 320/132 |
| 6,084,523 A | 7/2000 | Gelnovatch et al. | | |
| 6,377,028 B1 * | 4/2002 | Armstrong et al. | ............ | 320/136 |
| 7,741,813 B2 | 6/2010 | Taylor | | |
| 7,911,088 B2 * | 3/2011 | Mutabdzija et al. | ........... | 307/150 |
| 8,305,043 B2 * | 11/2012 | Yamamoto et al. | ............ | 320/150 |
| 2005/0038614 A1 | 2/2005 | Botts et al. | | |
| 2012/0130660 A1 * | 5/2012 | Neumeyer | ...................... | 702/63 |

FOREIGN PATENT DOCUMENTS

TW    I308450 B    4/2007

OTHER PUBLICATIONS

Power Agent Systems, Remote Battery Monitoring http://www.poweragentsystems.com/files/Power_Agent_Systems_BMS_Brochure_August_2008.pdf.
Battery Monitoring Solution, Nokia Siemens Networks by Kaizheng Fang, Daobin Mu, Shi Chen, Borong Wu, Feng Wu Nov. 2011 http://www.verveba-tel.com/PDF/NSN.pdf.

* cited by examiner

*Primary Examiner* — Sun Lin
(74) *Attorney, Agent, or Firm* — David Kelley, Esq.; Tung & Associates

(57) ABSTRACT

A monitor system for an inventoried battery includes at least one battery pack; at least one embedded monitor subsystem interfacing with the battery pack, the embedded monitor system adapted to acquire sensor data from the battery pack; and at least one archival data storage system interfacing with the embedded monitor subsystem, the archival data storage system adapted to archive the sensor data. A method of monitoring a stored battery is also disclosed.

20 Claims, 2 Drawing Sheets

MONITOR SYSTEM AND METHOD FOR STORED BATTERY

FIELD

Illustrative embodiments of the disclosure generally relate to battery packs for hybrid electric vehicles (HEVs) and electric vehicles (EVs). More particularly, illustrative embodiments of the disclosure relate to a monitor system and method in which sensor data is obtained from a stored battery.

BACKGROUND

Sensor data from battery packs in storage are not collected and analyzed. The stored battery packs may undergo some degree of environmental cycling and aging. From an engineering standpoint, sensor data which is acquired from stored battery packs may be beneficial to an understanding of battery cells and the battery pack as a system for such purposes as battery pack maintenance and future battery pack engineering.

Accordingly, a monitor system which monitors and acquires sensor data from a stored battery may be desirable for some applications.

SUMMARY

Illustrative embodiments of the disclosure are generally directed to a monitor system for an inventoried battery. The system includes at least one battery pack; at least one embedded monitor subsystem interfacing with the battery pack, the embedded monitor system adapted to acquire sensor data from the battery pack; and at least one archival data storage system interfacing with the embedded monitor subsystem, the archival data storage system adapted to archive the sensor data.

Illustrative embodiments of the disclosure are further generally directed to a method of monitoring a stored battery. An illustrative embodiment of the method includes acquiring sensor data from at least one battery pack during storage of the battery pack and archiving the sensor data.

BRIEF DESCRIPTION OF THE DRAWINGS

Illustrative embodiments of the disclosure will now be described, by way of example, with reference to the accompanying drawings, in which.

DETAILED DESCRIPTION

The following detailed description is merely exemplary in nature and is not intended to limit the described embodiments or the application and uses of the described embodiments. As used herein, the word "exemplary" or "illustrative" means "serving as an example, instance, or illustration." Any implementation described herein as "exemplary" or "illustrative" is not necessarily to be construed as preferred or advantageous over other implementations. All of the implementations described below are exemplary implementations provided to enable persons skilled in the art to practice the disclosure and are not intended to limit the scope of the appended claims. Moreover, the illustrative embodiments described herein are not exhaustive and embodiments or implementations other than those which are described herein and which fall within the scope of the appended claims are possible. Furthermore, there is no intention to be bound by any expressed or implied theory presented in the preceding technical field, background, brief summary or the following detailed description.

Figure 1:
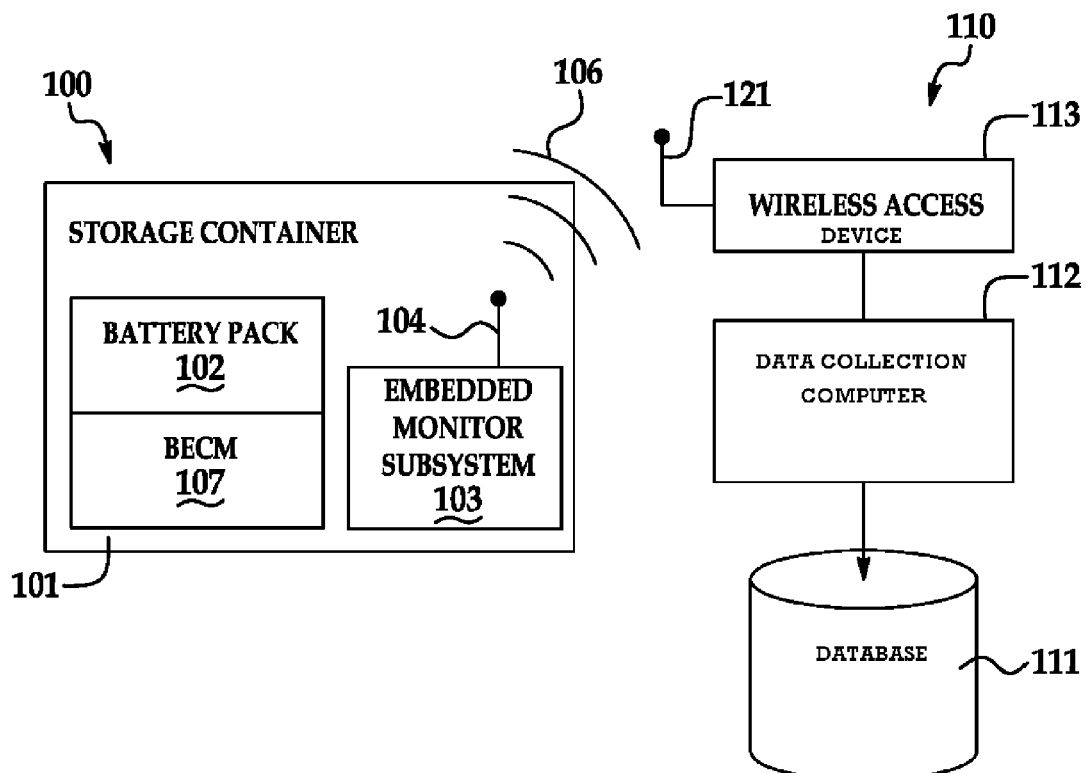
FIG. 1 is a block diagram of an illustrative embodiment of a monitor system for stored battery.

Referring initially to FIG. 1, an illustrative embodiment of a monitor system for a stored battery, hereinafter monitor system, is generally indicated by reference numeral 100. The monitor system 100 may include at least one storage container 101. The storage container 101 may contain at least one battery pack 102. In some embodiments, the battery pack 102 may be used as a source of electrical power in a hybrid electric vehicle (HEV) or electric vehicle (EV), for example and without limitation. A BECM (Battery Energy Control Module) 107 may be provided within the battery pack 102. At least one embedded monitor subsystem 103 may interface with the BECM 107 in the storage container 101. The embedded monitor subsystem 103 may include a transmitter antenna 104 which transmits wireless signals 106 for purposes which will be hereinafter described.

At least one archival sensor data storage system 110 may communicate with the embedded monitor subsystem 103. The archival sensor data storage system 110 may include a wireless access device 113 having a receiver antenna 121 which receives the wireless signals 106 transmitted by the transmitter antenna 104 of the embedded monitor subsystem 103. A central sensor data collection computer 112 may interface with the wireless access device 113. An archival sensor database 111 may interface with the central sensor data collection computer 112. Accordingly, in operation of the monitor system 100, which will be hereinafter further described, the embedded monitor subsystem 103 acquires sensor data from the BECM 107 of the battery pack 102 during storage of the battery pack 102. The transmitter antenna 104 of the embedded monitor subsystem 103 transmits the sensor data via the wireless signals 106 to the wireless access device 113. The central sensor data collection computer 112 obtains the sensor data from the wireless access device 113. The archival sensor database 111 stores and archives the sensor data from the central sensor data collection computer 112 to support data mining and analysis for such use as battery pack design and maintenance, for example and without limitation. The transmitted sensor data may include the voltage or state of health of the battery pack 102.

Figure 2:
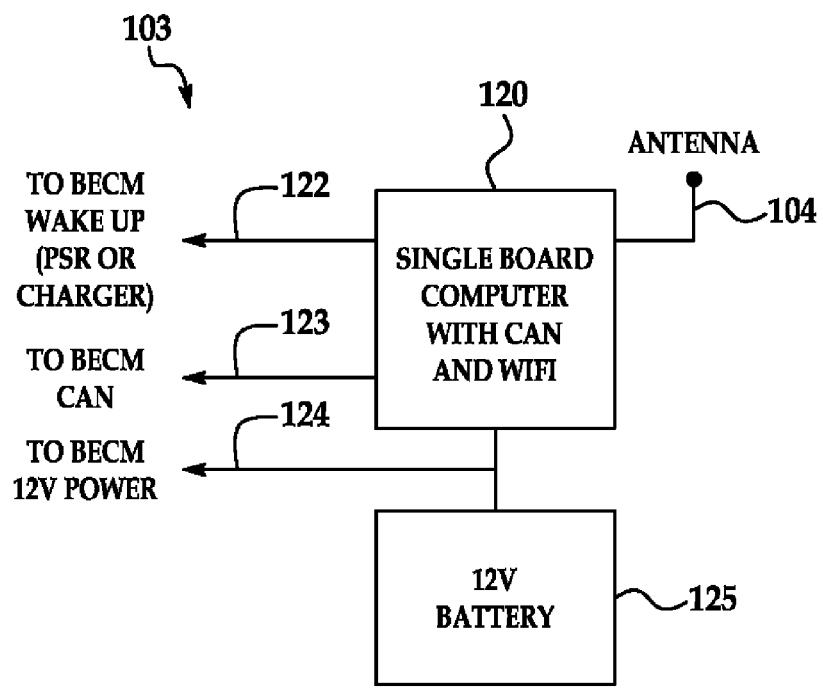
FIG. 2 is a block diagram of an exemplary embedded monitor subsystem according to an illustrative embodiment of a monitor system for stored battery.

Referring next to FIG. 2, an exemplary embedded monitor subsystem 103 of the monitor system 100 is shown. The embedded monitor subsystem 103 may include a subsystem computer 120 which may include a single board computer with CAN and wireless connection capability such as a WiFi connection, for example and without limitation, to the BECM 107 of the battery pack 102. The transmitter antenna 104 may interface with the subsystem computer 120. A BECM wakeup (Power Sustain Relay or charger) connection 122 may interface with the subsystem computer 120 and with the BECM 107 of the battery pack 102 (FIG. 1). A BECM CAN connection 123 may interface with the subsystem computer 120 and the CAN (Controller Area Network) of the BECM 107. At least one subsystem battery 125 may interface with the subsystem computer 120. The subsystem battery 125 may be a 12V battery, for example and without limitation, and may be sized to provide power to the BECM 107 and subsystem computer 120 for the anticipated storage period. A BECM power connection 124 may interface with the subsystem computer 120 and the subsystem battery 125 and with the BECM 107.

In exemplary application of the monitor system 100, the subsystem computer 120 of the embedded monitor subsystem 103 will periodically wake the BECM 107 of the battery pack 102 in a normal mode via the BECM wakeup connection 122 during storage of the battery pack 102. The subsystem computer 120 will maintain the wakeup signal to the BECM 107 for a period sufficient for the BECM 107 to initialize and acquire sensor data from the Battery Pack 102. The subsystem computer 120 will monitor the CAN of the BECM 107 via the BECM CAN connection 123 while the BECM 107 is awake. The subsystem computer 120 may also query the BECM 107 for results of the BECM's self-diagnostic routines over CAN.

Via the BECM CAN connection 123, the CAN of the BECM 107 transmits sensor data which relates to the environmental cycling and aging of the battery pack 102 and BECM diagnostic data to the subsystem computer 120 of the embedded monitor subsystem 103. The subsystem computer 120 then allows the BECM 107 to shutdown by de-asserting the wakeup signal via the BECM Wakeup connection 122, thus conserving subsystem battery 125 power. The subsystem computer 120 transmits the acquired sensor data via the transmitter antenna 104, the wireless signals 106, the receiver antenna 121 and the wireless access device 113 to the central sensor data collection computer 112. The central sensor data collection computer 112 may archive the sensor data in the archival sensor database 111 to support data mining and analysis by appropriate personnel. The personnel may utilize the sensor data in real-time for the maintenance of existing battery packs 102 and/or the future engineering and design of battery packs 102, for example and without limitation.

In some embodiments, the interval for waking the BECM 107 may be 30-60 minutes or longer. The interval may be implementation-driven based upon packaging, storage duration, battery sizing and the electrical loads of the BECM 107 and embedded monitor subsystem 103. In some embodiments, the interval may be based on an algorithm that may decrease the interval (acquire data more frequently) if analysis of the acquired data begins to trend abnormally.

Figure 3:
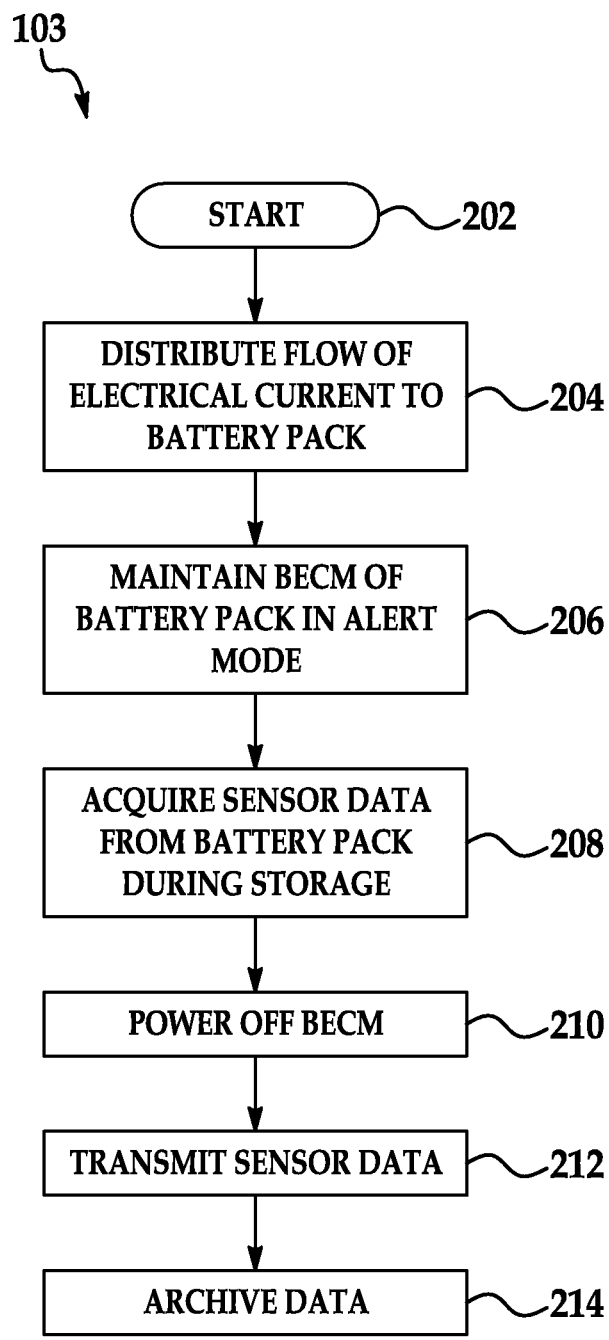
FIG. 3 is a flow diagram of an illustrative embodiment of a monitor method for a stored battery.

Referring next to FIG. 3, a flow diagram 200 of an illustrative embodiment of a monitor method for inventoried battery is shown. The method begins in block 202. In block 204, a flow of electrical current is distributed to a battery pack. In block 206, the BECM of the battery pack is maintained in an alert mode. In block 208, sensor data is obtained from the battery pack during storage of the battery pack. In block 210, the BECM is powered off to conserve power. In block 212, the sensor data may be transmitted wirelessly. In block 214, the sensor data may be archived. The archived sensor data may support data mining and analysis for the maintenance of existing battery packs and/or the future engineering and design of battery packs, for example and without limitation.

In some embodiments, it may be desirable to allow the embedded monitor subsystem 103 to periodically awaken such as by using an internal timer (not illustrated) or alternatively, via Wake on Wireless (WoWLAN), perform its function and then return to a sleep mode. Accordingly, in the flow diagram 200 of FIG. 3, the embedded monitor subsystem 103 may initially wake up before block 204 and subsequently power down after transmission of the data to the central data collection computer 112 (after block 212). WoWLAN would allow the central data collection computer 112 trigger the data acquisition event remotely. Alternatively, in use of an internal timer, rather than using a fixed interval, the central data collection computer 112 may transmit the next desired interval to the embedded monitor subsystem 103 based upon data analysis as was described hereinabove.

Although the embodiments of this disclosure have been described with respect to certain exemplary embodiments, it is to be understood that the specific embodiments are for purposes of illustration and not limitation, as other variations will occur to those of skill in the art.

What is claimed is:

1. A monitor system for an inventoried battery, comprising:
   at least one battery pack;
   at least one embedded monitor subsystem interfacing with the at least one battery pack, the at least one embedded monitor subsystem comprising a computer processor configured to acquire sensor data from the battery pack, the sensor data comprising voltage data related to performance of the battery pack; and
   at least one archival data storage system interfacing with the at least one embedded monitor subsystem, the at least one archival data storage system configured to archive the sensor data.

2. The monitor system of claim 1 wherein the at least one embedded monitor subsystem comprises a subsystem computer and at least one subsystem battery interfacing with the subsystem computer, the subsystem computer interfacing with a BECM (Battery Energy Control Module), the BECM associated with the at least one battery pack and configured to initialize and acquire sensor data from the at least one battery pack.

3. The monitor system of claim 2 further comprising a BECM wakeup connection interfacing with the subsystem computer of the at least one embedded monitor subsystem and the BECM.

4. The monitor system of claim 2 further comprising a BECM connection interfacing with the subsystem computer of the at least one embedded monitor subsystem and the BECM.

5. The monitor system of claim 2 further comprising a BECM power connection interfacing with the subsystem computer of the at least one embedded monitor subsystem and the BECM.

6. The monitor system of claim 1 wherein the at least one archival data storage system comprises a central data collection computer interfacing with the at least one embedded monitor subsystem and an archival database interfacing with the central data collection computer.

7. The monitor system of claim 1 wherein the at least one embedded monitor system is configured to wirelessly transmit the sensor data to the at least one archival data storage system.

8. The monitor system of claim 7 wherein the at least one archival data storage system comprises a wireless access device interfacing with the at least one embedded monitor subsystem, a central data collection computer interfacing with the wireless access device and an archival database interfacing with the central data collection computer.

9. A monitor system for an inventoried battery, comprising:
   a storage container;
   at least one battery pack in the storage container;
   at least one embedded monitor subsystem in the storage container, the at least one embedded monitor subsystem interfacing with the at least one battery pack and comprising a computer processor configured to distribute flow of an electrical current to the at least one battery pack, including providing power to maintain a BECM (Battery Energy Control Module) associated with the battery pack in an alert mode, the BECM configured to acquire sensor data from the battery pack, the alert mode comprising maintaining the BECM operational for at least a time period sufficient to acquire the sensor data; and at least one archival data storage system interfacing with the at least one embedded monitor subsystem, the at least one archival data storage system configured to archive the sensor data, the sensor data comprising voltage data related to performance of the battery pack.

10. The monitor system of claim 9 wherein the at least one embedded monitor subsystem comprises a subsystem computer and at least one subsystem battery interfacing with the subsystem computer.

11. The monitor system of claim 10 further comprising a BECM wakeup connection interfacing with the subsystem computer of the at least one embedded monitor subsystem and the BECM.

12. The monitor system of claim 10 further comprising a BECM CAN (Controller Area Network) connection interfacing with the subsystem computer of the at least one embedded monitor subsystem and the BECM.

13. The monitor system of claim 10 further comprising a BECM power connection interfacing with the subsystem computer of the at least one embedded monitor subsystem and the BECM.

14. The monitor system of claim 9 wherein the at least one archival data storage system comprises a central data collection computer interfacing with the at least one embedded monitor subsystem and an archival database interfacing with the central data collection computer.

15. The monitor system of claim 9 wherein the at least one embedded monitor system is configured to wirelessly transmit the sensor data to the least one archival data storage system.

16. The monitor system of claim 15 wherein the at least one archival data storage system comprises a wireless access device interfacing with the at least one embedded monitor subsystem, a central data collection computer interfacing with the wireless access device and an archival database interfacing with the central data collection computer.

17. A method of monitoring a stored battery, the method implemented by a computer processor executing programmed instructions stored in non-transitory memory, the method comprising:

the computer processor acquiring sensor data from at least one battery pack during storage of the at least one battery pack, the sensor data comprising battery voltage data, the sensor data comprising voltage data related to performance of the battery pack; and archiving the sensor data.

18. The method of claim 17 further comprising distributing flow of an electrical current to the at least one battery pack including to power a BECM (Battery Energy Control Module), the BECM associated with the at least one battery pack and configured to acquire sensor data from the at least one battery pack.

19. The method of claim 18 further comprising maintaining the BECM of the battery pack in an alert mode, the alert mode comprising maintaining the BECM operational for at least a time period sufficient to acquire the sensor data.

20. The method of claim 17 further comprising transmitting the sensor data for the archiving, the transmitting comprising wireless transmission.

\* \* \* \* \*